United States Patent [19]

Yamamoto et al.

[11] 4,080,478
[45] Mar. 21, 1978

[54] METHOD FOR PRODUCING AN InSb THIN FILM

[75] Inventors: Naoki Yamamoto, Kokubunji; Tetsu Oi, Tokyo; Kikuji Sato, Kokubunji, all of Japan

[73] Assignee: Hitachi, Ltd., Japan

[21] Appl. No.: 603,529

[22] Filed: Aug. 11, 1975

[30] Foreign Application Priority Data

Aug. 14, 1974 Japan .................................. 49-92328

[51] Int. Cl.² .......................................... H01F 10/02
[52] U.S. Cl. .................................. 427/130; 427/128; 427/131
[58] Field of Search .............................. 427/127–132, 427/47, 48, 154, 156

[56] References Cited

U.S. PATENT DOCUMENTS

| | | | |
|---|---|---|---|
| 3,341,358 | 9/1967 | Clawson et al. | 427/127 X |
| 3,454,433 | 7/1969 | Mueller | 427/156 X |
| 3,642,533 | 2/1972 | Ahn et al. | 427/131 X |

Primary Examiner—Bernard D. Pianalto
Attorney, Agent, or Firm—Craig & Antonelli

[57] ABSTRACT

A method for producing a unique InSb thin film element which comprises the steps of forming a thin film of InSb polycrystal on a substrate of insulating material, forming an oxide film on the InSb thin film, zone-melting the InSb thin film by heating the thin film covered with the oxide film to a temperature above the melting point of InSb in a controlled gaseous heat-treating atmosphere comprising an inert gas containing from 1 ppm to $3 \times 10^4$ ppm of oxygen, which is replaceable by an addition of a tenfold amount of aqueous vapor to the extent of $10^2$ ppm of oxygen, and cooling the resultant element. An InSb thin film element produced in this way is suitable as a material for a magnetosensitive element of good performance, especially a low noise level or a high S/N ratio.

16 Claims, 5 Drawing Figures

METHOD FOR PRODUCING AN InSb THIN FILM

BACKGROUND OF THE INVENTION i. Field of the Invention

The present invention relates to a method for producing an InSb thin film element for use as a magnetosensitive element, and more particularly to the use of a unique heat-treating atmosphere during production of said thin film element.

ii. Brief Description of the Prior Art

It is necessary to obtain an InSb thin film element containing a crystal grain having a major axis of at least 30 μm, in order to produce a magnetosensitive element of high sensitivity comprising an InSb film of 3 μm(thickness). This fact was discovered previously by the inventors. For this purpose, the well known "zone-melting" technique, which is described in the paper A. R. Clawson; *Intern. Conf. Thin Film*, Paper 5.13, Venice, May 15–19, 1972, is suitable.

Previously, this zone-melting has been carried out in an atmosphere of a high purity inert gas such as helium or nitrogen.

The properties of an InSb thin film conventionally zone-melted in the aforementioned high purity inert gas are as follows: Hall coefficient of 100 ~ 300 cm$^3$/C, electron mobility of 8000 ~ 30000 cm$^2$/Vs, specific resistivity of $3 \times 10^{-3} \sim 4 \times 10^{-2}$ Ωcm, noise level of a bridge-type element of 0.6 ~ 15 μV and S/N ratio of 40 ~ 65 dB. These values are measured under 5000 A/cm$^3$ of current density and 10 Gauss of magnetic flux density.

However, an InSb thin film with these values is insufficient as a material for a magnetosensitive element of high sensitivity having a low noise level or a high S/N ratio. The sufficient values for a good magnetosensitive element, especially an element for a Hall head, are as follows: Hall coefficient greater than 300 cm$^3$/C, electron mobility greater than 30,000 cm$^2$/Vs, specific resistivity lower than $1 \times 10^{-2}$ μ.cm, noise level lower than 0.8 μV and S/N ratio higher than 70 dB measured as mentioned above. Therefore, the properties of previous InSb thin films make them unsuitable for practical use, the noise level or S/N ratio of said previous thin films make them especially out of the question for use as a Hall head.

SUMMARY OF THE INVENTION

The object of the present invention is to provide an improved method for producing InSb thin film elements having none of the defects of the films described above and having a sufficiently low noise level or high S/N ratio for use as a high-sensitive magnetosensitive element. In other words, it is the object of this invention to provide a method for producing a InSb thin film element suitable for use as a Hall head, an infra-red detecting element, a Hall element for a d.c. motor and other magnetosensitive elements having a low noise level and no lower sensitivity than conventional InSb film elements. With respect to use as a magnetic head, the object of this invention is to provide a method for producing a high-sensitive Hall head having a low noise level or a high S/N ratio comparable to high quality coil-type magnetic heads.

The method of the present invention for producing an InSb thin film element comprises the following steps:

a. forming a thin film of InSb polycrystal on a substrate having at least one face composed of insulating material, b. forming an oxide film on said thin film, c. zone-melting said thin film by heating the resulting film composite to a temperature above the melting point of InSb in a controlled heat-treating atmosphere of an inert gas, i.e. helium or argon or nitrogen gas, containing from 1 ppm to $3 \times 10^4$ ppm of oxygen.

d. Cooling said thin film composite to room temperature, and e. removing said oxide film.

This method is characterized by step (c) which differs from the previous methods. It will be understood that the controlled atmosphere may be a mixture of inert gases with or without nitrogen. An In$_2$O$_3$ film is preferred as said oxide film in step (b).

The zone-melting procedure followed in step (c) is replaceable by ordinary heating to a temperature above the melting point of InSb in said controlled atmosphere. However, the properties of said thin film become slightly poorer by this replacement step. Therefore, the use of zone-melting is preferred.

The oxygen content in said controlled atmosphere preferably ranges from $1 \times 10$ ppm to $3 \times 10^4$ ppm, and more preferably from $1 \times 10^2$ ppm to $3 \times 10^3$ ppm.

Up to 10$^2$ ppm of oxygen in the inert gas or nitrogen gas is replaceable wholly or partly by the addition of a tenfold amount of aqueous vapor, i.e., up to 10$^3$ ppm of aqueous vapor. However, it is preferable to keep the aqueous vapor to a minimum, when the oxygen content is sufficient. The well-known method for removing the metal oxide film may be used in step (e).

An InSb thin film element produced by the method of the present invention is suitable for a magnetosensitive element, especially a Hall element for a Hall magnetic head, as it has a lower noise level or higher S/N ratio, and other comparative or better properties than a conventional Hall element of best quality.

The gases other than nitrogen which are suitable for use as the inert gas in the controlled gas atmosphere include rare gases and mixtures thereof.

Other and further objects, features and advantages of this invention will appear more fully from the following description in connection with the accompanying drawings.

DETAILED DESCRIPTION OF THE INVENTION

Figure 1:
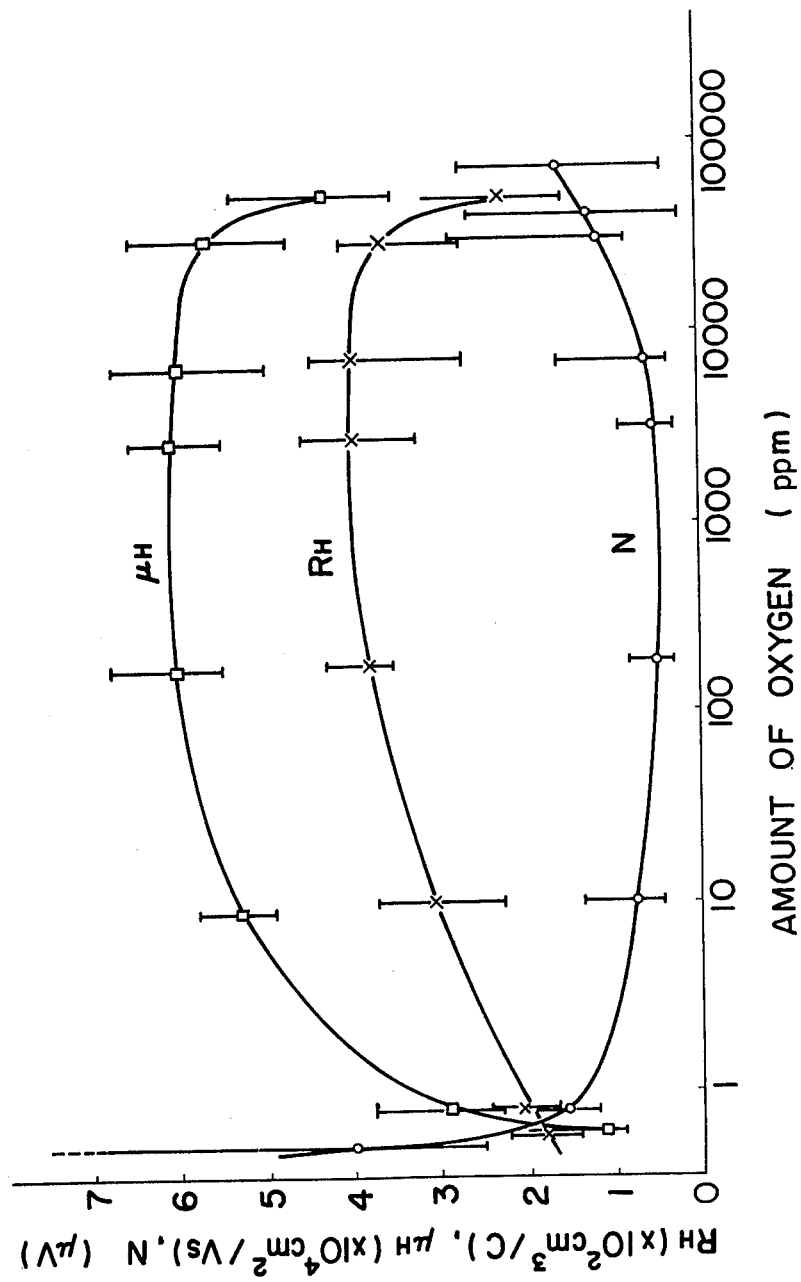
FIG. 1 is a graph showing the oxygen content dependency of the Hall coefficient, the electron mobility and the noise level of an InSb thin film element.

The Hall coefficient $R_H$, electron mobility $\mu_H$, and noise level N of the InSb thin film elements formed on substrates made of insulating material depend on the amount of oxygen added to the aforementioned controlled heat-treating atmosphere composed of an inert gas (helium in this case) as is shown in FIG. 1. The scattering ranges of the measured value are also shown in FIG. 1.

As is seen from FIG. 1, the desirable oxygen content ranges from 1 ppm to $3 \times 10^4$ ppm when it is necessary to lower the above-mentioned noise level significantly. When the oxygen content is lower than 1 ppm, the noise level increases remarkably. Further, when the oxygen content becomes higher than $3 \times 10^4$ ppm, the scatter of the noise level increases and Hall coefficient and electron mobility rapidly decrease.

However, an oxygen content range of from 10 ppm to $3 \times 10^4$ ppm is desirable when a high Hall coefficient and/or high electron mobility is also necessary, because these properties are comparatively poor outside of the above oxygen content range as can be seen from FIG. 1. The reason why the Hall coefficient and electron mobility decrease considerably at over $3 \times 10^4$ ppm, i.e., over 3 wt.% of oxygen is that the metallic antimony precipitates out in a considerable amount in the InSb thin film portion of the thin film element.

Figure 2:
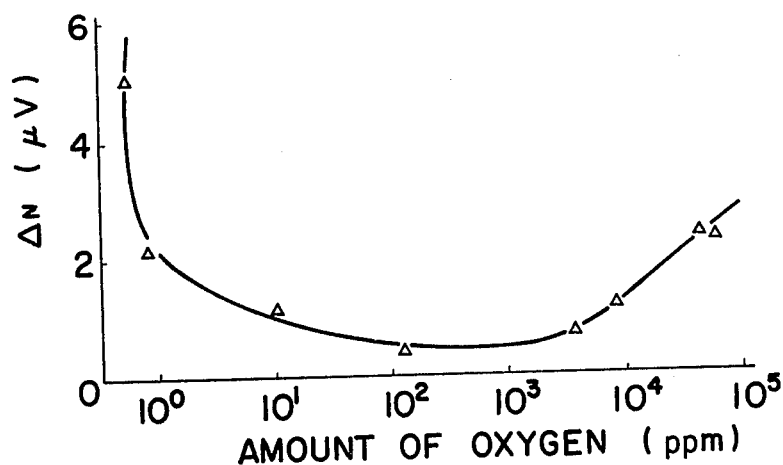
FIG. 2 is a graph showing the relationship between the scatter of the noise level of an InSb thin film element and the oxygen content of the controlled heat-treating atmosphere.

Furthermore, as apparent from FIG. 2, the scatter of noise level is lowest when the oxygen content of the heat-treating atmosphere ranges from $10^2$ ppm to $3 \times 10^3$ ppm. In this oxygen content range, the other properties of the InSb thin film element are also best as is shown in FIG. 1. Therefore, the most desirable oxygen content range is from $10^2$ ppm to $3 \times 10^3$ ppm.

The values of the scattering of the noise level $\Delta_N$ in FIG. 2 are calculated from the data measured on an InSb thin film element heat-treated at 530° C. in helium containing 1 ppm of $H_2O$ and various amounts of oxygen. The scatter of the noise level $\Delta_N$ is calculated according to the following formula:

$$\Delta_N = 6 \left\{ \sum_i \frac{(x_i - \bar{x})}{n} \right\}^{\frac{1}{2}}$$

where $x_i$, $\bar{x}$ and $n$ are the individual value, mean value and number of individual values of the noise level, respectively. In FIG. 2, the ordinate shows the scatter of the noise level $\Delta_N(\mu V)$ and the abscissa shows the oxygen content (ppm) in the controlled heat-treating atmosphere.

Figure 3:
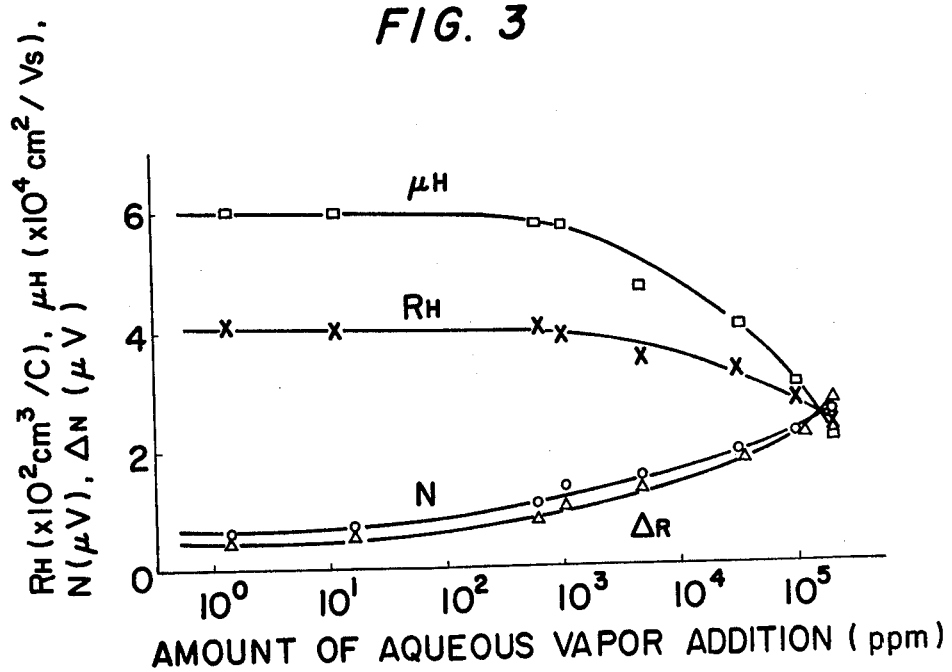
FIG. 3 indicates the relationship between the properties of an InSb thin film such as the Hall coefficient, electron mobility, noise level and scatter of the noise level, and the addition of aqueous vapor in the controlled heat-treating atmosphere containing about 1000 ppm of oxygen.

An addition of less than $10^3$ ppm of aqueous vapor to a heat-treating atmosphere having a suitable amount of oxygen is harmless except for slight increases of the noise level and the scatter thereof, as is seen from Table 1 and FIG. 3, in which the ordinate represents the Hall coefficient $R_H$, electron mobility $\mu_H$, noise level N, and scatter of noise level $\Delta_N$, and the abscissa represents the addition of aqueous vapor to a heat-treating atmosphere composed of an inert gas having 1000 ppm of oxygen. There are also described in Table 1 the Hall coefficient, electron mobility and noise level of the InSb thin films heat-treated in an atmosphere having 300 ppm of oxygen.

It is apparent from FIG. 3 that the addition of greater than $10^3$ ppm of aqueous vapor lowers the Hall coefficient and electron mobility, and is unsuitable for producing a good InSb thin film.

Figure 4:
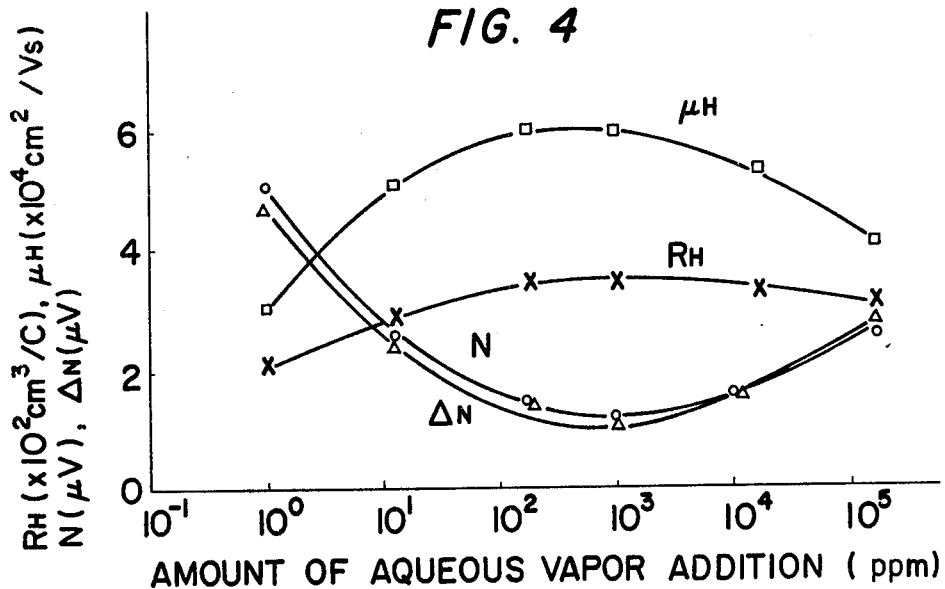
FIG. 4 is a graph showing the same relationship as FIG. 3 with the exception that the oxygen content is only about 0.1 ppm.

It is seen from FIG. 4, which illustrates the same relationship as FIG. 3 except that only 0.1 ppm of oxygen is contained in the heat-treating atmosphere, that the noise level N and its scatter $\Delta_N$ decrease with an increase of the aqueous vapor addition up to $10^3$ ppm thereof and that they increase with an increase of the aqueous vapor addition greater than $10^3$ ppm. Therefore, Table 1

| Amount of Aqueous Vapor (ppm) | Hall Coefficient (cm³/C) | Electron Mobility (cm²/Vs) | Noise Level (μV) |
|---|---|---|---|
| $6 \times 10^2$ | 350~500 | 50000~65000 | 0.3~0.5 |
| $1 \times 10^3$ | 350~500 | 50000~65000 | 0.3~0.7 |
| $5 \times 10^3$ | 250~450 | 30000~65000 | 0.3~1.4 | an addition of less than $10^3$ ppm of aqueous vapor into the heat-treating atmosphere is useful for improving the above-mentioned properties, especially the noise level and its scatter, of the InSb thin film element when the oxygen content in the controlled heat-treating atmosphere is not high enough for this purpose. However, the improvement of these noise properties, by the addition of aqueous vapor is not as large as by the addition of oxygen.

Figure 5:
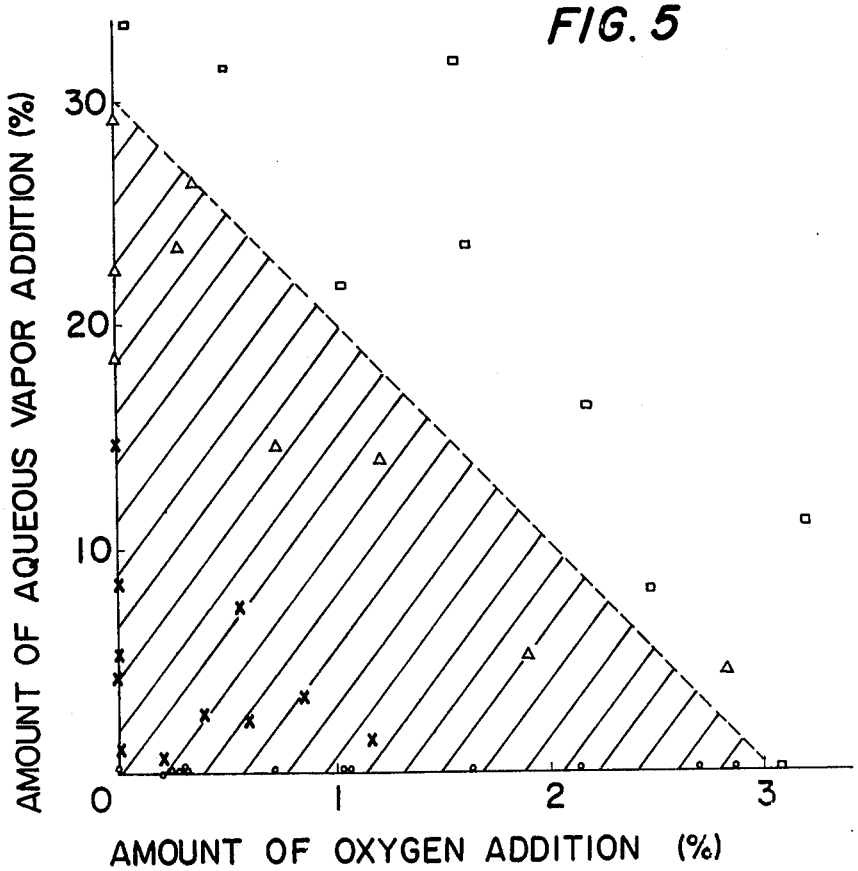
FIG. 5 is the graphical representation of the dependency of the properties of an InSb film on the oxygen contents and the aqueous vapor addition in the heat-treating atmosphere.

FIG. 5 illustrates the relationship between the properties of a InSb thin film element and the addition amount of oxygen and aqueous vapor in the heat-treating atmosphere. In FIG. 5, the symbols o, x, △ and □ are explained in Table 2. The noise Table 2

| Symbol | Noise Level (μV) | Hall Coefficient (cm³/³¹C) | Electron Mobility (cm²/Vs) |
|---|---|---|---|
| o | $\leq 0.6$ | $\geq 300$ | $\geq 40000$ |
| x | 0.6~2 | $\geq 300$ | $\geq 40000$ |
| △ | 0.6~2 | $\geq 300$ | 30000~40000 |
| □ | $\geq 2$ | $\leq 400$ | $\leq 30000$ | level is measured with a bridge-type element under 5000 A/cm² of current density. The properties of a specimen heat-treated in an atmosphere to which such amounts of oxygen and aqueous vapor were added as indicated in FIG 5 by the □ symbol, are comparable or poorer than the properties of previous InSb thin film element. On the other hand, the properties represented by the other symbols in FIG. 5 are better than those of previous film elements. The useful amounts of the oxygen and aqueous vapor range within the hatched region of FIG. 5. Therefore, the total amount of oxygen and a tenth of the total amount of aqueous vapor should be less than $3 \times 10^4$ ppm. In other words, the oxygen in the controlled heat-treating atmosphere is replaceable by the addition of a tenfold amount of aqueous vapor. The upper limitation of the addition of aqueous vapor has been described above. The above-mentioned data were obtained in experiments using helium as the inert gas, but the same results were obtained in the case of another inert gas or nitrogen.

In conclusion, the heat-treating atmosphere composed of an inert gas or nitrogen should contain most preferably from $1 \times 10^2$ ppm to $3 \times 10^3$ ppm of oxygen and as little aqueous vapor as possible. However, in practice it is difficult to reduce aqueous vapor content to zero.

DESCRIPTION OF THE PRESENTLY PREFERRED EMBODIMENTS (EXAMPLE 1)

A 3 μm thick InSb thin film was deposited on a soda glass substrate using the well known vacuum deposition method. Then an $In_2O_3$ film (0.03 μm thick) was formed on the surface of the InSb film by first depositing In thereon and then heating it to 300° ~ 350° C. in an oxidizing atmosphere. After that, the zone-melting of the InSb thin film was carried out at 530° C. in a helium atmosphere containing about 300 ppm of oxygen using the well known hot-wire method. Then the $In_2O_3$ film was removed by lapping. The resultant properties of the InSb thin film were as follows: Hall coefficient, electron mobility and noise level were 430 $cm^3/C$, 65000 $cm^2/Vs$ and 0.6 μV, respectively. The noise level was measured under 5000 $A/cm^2$ of current density. Also, the S/N ratio was 76 dB.

EXAMPLE 2

A 3 μm thick InSb thin film was deposited on a mica substrate, then an $In_2O_3$ film (0.03 μm thick) was formed on the surface of the InSb film by the same process used in Example 1. After that, heat-treatment at 540° C. was carried out on the InSb film covered with the $In_2O_3$ film in an atmosphere containing about 100 ppm of oxygen, and argon to which about 500 ppm of aqueous vapor was added, and it was heated by electric furnace. Then, the InSb film was cooled to room temperature at a cooling rate of 100° C/hr. Then the $In_2O_3$ film was removed by lapping. The Hall coefficient, electron mobility, noise level and S/N ratio of the InSb thin film element thus obtained were 350 $cm^3/C$, 53000 $cm^2/Vs$, 0.9μV and 72dB, respectively. The noise level was measured at a current density of 5000 $A/cm^2$.

On the other hand, an electron mobility of 31000 $cm^2/Vs$, a noise level of 1.8μV and a S/N ratio of 63dB were obtained for an InSb thin film element heat-treated in an inert gas of high purity to which no oxygen and no aqueous vapor were added. These values are poorer than those obtained for the samples produced by the method of this invention.

EXAMPLE 3

The properties of InSb thin film element produced according to the present invention, as described with reference to FIGS. 1 - 5, are shown in the following table.

Table 3

| Amount of oxygen | $1\sim3\times10^4$ | $10\sim3\times10^4$ | $10^2\sim3\times10^3$ |
|---|---|---|---|
| Hall coefficient ($\times 10^2 cm^3 C$) | 1.5~4.6 | 2.3~4.6 | 3.4~4.6 |
| Electron mobility ($\times 10^4 cm^2 Vs$) | 2.3~6.8 | 4.9~6.8 | 5.4~6.8 |
| Specific resistivity ($\times 10^{-3}\Omega\cdot cm$) | 5.9-7.5 | 4.2~7.5 | 5.7~7.5 |
| Noise level (μV) | 2.0~0.3 | 1.3~0.3 | 0.8~0.3 |
| S/N ratio (dB) | 58~84 | 65~84 | 73~84 |

The data of Hall coefficient, electron mobility and noise level and Table 3 accord with the data presented in FIG. 1. The specific procedure used for forming such InSb film element is the same as in Example 1 except for the amounts of oxygen in the inert gas atmosphere.

Suitable insulating materials for purposes of this invention include soda glass, mica, alumina and insulating materials containing at least a fraction or 3 mol % of alumina. Also, the controlled heat-treating atmosphere is maintained at a pressure of about 1 atm. However, it is harmless to increase or reduce the pressure.

It will be appreciated that the thickness of the oxide film applied to the InSb thin film may be from 0.01 to 0.15 μm; whereas the thickness of the InSb thin film may be from 0.5 to 10 μm. Also, the oxide film may be $In_2O_3$.

The heat-treating temperature may range from 525° to 550° C., and preferably is from 525° to 535° C. The period of heat treatment may range from 0.01 to 0.85 hours, and the rate of cooling may be at most 30,000° C. per hour.

The reasons for the above-mentioned ranges are as follows:

a. Oxide film thickness; there is no protective effect in the thickness under 0.01 μm, and the necessary period for forming the oxide film becomes too long and the removal of the oxide film becomes difficult when the thickness thereof is over 0.15 μm.

b. InSb film thickness; the electron mobility of the InSb thin film becomes lower than about $2 \times 10^4 cm^2/Vs$ when the thickness of the InSb film is under 0.5 μm, and the formation of the InSb film becomes difficult when the thickness thereof is over 10 μm.

c. Heat-treating temperature; the InSb film cannot melt at the heat-treating temperature of under 525° C., and $In_2O_3$ film becomes too thick when the heat-treating temperature is over 550° C.

d. Period of heat-treatment; when it is longer than 0.85 hours, the $In_2O_3$ film becomes too thick. It may be very short so far as the aimed portion of the InSb film becomes melted, and the necessary period for melting it is usually approximately 0.01 hours at least.

e. Cooling rate; if the cooling rate is higher than 30,000° C. per hour, the insulating material, which composes the substrate, may crack in some cases.

What is claimed is:

1. A method for producing an InSb thin film element having the following parameters: A Hall coefficient of 340 to 460 $cm^3/C$, an electron mobility of 54,000 to 68,000 $cm^2/Vs$, a specific resistivity of $5.7 \times 10^{-3}$ to $7.5 \times 10^{-3} \Omega$ cm, a noise level of a bridge-type element of 0.3 to 0.8 μV and a S/N ratio of 73 to 84 dB, said parameters being measured under 5,000 $A/cm^2$ of current density and 10 Gauss of magnetic flux density, which comprises the steps of forming a thin film of InSb polycrystal on a substrate at least one face of which is composed of an insulating material, forming an oxide film on said thin film, heat-treating the thin film on which the oxide film is formed by heating the oxide film and the thin film to a temperature above the melting point of InSb in an atmosphere consisting essentially of at least one inert gas or nitrogen and from 1 ppm to $3 \times 10^4$ ppm of oxygen, cooling said thin film to room temperature and removing the oxide film from said thin film.

2. The method according to claim 1, wherein said heat-treating is a zone-melting.

3. The method according to claim 1, wherein said atmosphere contains from $1 \times 10$ ppm to $3 \times 10^4$ ppm of oxygen.

4. The method according to claim 1, wherein said atmosphere contains from $1 \times 10^2$ ppm to $3 \times 10^3$ ppm of oxygen.

5. The method according to claim 1, wherein said oxygen is replaced to the extent of $10^2$ ppm by the addition of a tenfold amount of aqueous vapor.

6. The method according to claim 1, further comprising removing the oxide film by lapping said oxide film comprising a film of $In_2O_3$ and said InSb thin film element comprising a magnetosensitive element.

7. A method for producing an InSb thin film element for use as a magnetosensitive element which comprises forming a thin film of InSb polycrystal on an insulating substrate, forming a film of $In_2O_3$ on said thin film, zone-melting said thin film at a temperature above the melting point of InSb in an atmosphere consisting essentially of at least one inert gas or nitrogen and 1 ppm to $3 \times 10^4$ ppm oxygen, cooling said thin film to room temperature and thereafter removing said film of $In_2O_3$ to provide an element exhibiting the following parameters: a Hall coefficient of 340 to 460 $cm^3/C$, an electron mobility of 54,000 to 68,000 $cm^2/Vs$, a specific resistivity of $5.7 \times 10^{-3}$ to $7.5 \times ^{-3}\Omega$ cm, a noise level of a bridge-type element of 0.3 to 0.8$\mu$V and a S/N ratio of 73 to 84 dB, said parameters being measured under 5000 $A/cm^2$ of current density and 10 Gauss of magnetic flux density.

8. A method according to claim 7, wherein zone-melting is effected at a temperature of from 525° to 550° C. from a period of about 0.01 to 0.85 hours.

9. A method according to claim 7, wherein the film of InSb polycrystal is formed to have a thickness of from 0.5$\mu$m to 10$\mu$m and the $In_2O_3$ film is formed to have a thickness of from 0.01$\mu$m to 0.15$\mu$m.

10. A method according to claim 7, wherein said insulating substrate is formed of a material selected from the group consisting of soda glass, mica, alumina and an insulating material containing at least 3 mol % of alumina.

11. A method according to claim 7, wherein said thin film is cooled to room temperature at a rate which is not more than 30,000° C. per hour.

12. A method according to claim 7, wherein the oxygen in said atmosphere is replaced to the extent of $10^2$ ppm by the addition of a tenfold amount of aqueous vapor.

13. A method for producing an InSb thin film element having the following parameters: a Hall coefficient of 340 to 460 $cm^3/C$, an electron mobility of 54,000 to 68,000 $cm^2/Vs$, a specific resistivity of $5.7 \times 10^{-3}$ to $7.5 \times 10^{-3}\Omega cm$, a noise level of a bridge-type element of 0.3 to 0.8$\mu$V and a S/N ratio of 73 to 84 dB, said parameters being measured under 5000 $A/cm^2$ of current density and 10 Gauss of magnetic flux density, which comprises forming a thin film of InSb polycrystal on an insulating substrate, forming a film of $In_2O_3$ on said thin film, zone-melting said thin film by heating the thin film to a temperature of from 525° to 550° C. in an atmosphere consisting of at least one inert gas or nitrogen and from 1 ppm to $3 \times 10^4$ ppm of oxygen or 1 ppm to $3 \times 10^4$ ppm of oxygen with up to $10^2$ ppm of said oxygen being replaced by an addition of a ten-fold amount of aqueous vapor, cooling said thin film to room temperature and thereafter removing said film of $In_2O_3$ by lapping.

14. A method according to claim 13, wherein said thin film of InSb polycrystal is formed to have the thickness of from 0.5$\mu$m to 10$\mu$m and the $In_2O_3$ film is formed to have a thickness of from 0.01$\mu$m to 0.15$\mu$m.

15. A method according to claim 14, wherein the zone-melting is effected for a period of from 0.01 to 0.85 hour.

16. A method according to claim 15, wherein the thin film is cooled at a cooling rate which does not exceed 30,000° C. per hour.

* * * * *